United States Patent
Martensson

(10) Patent No.: US 8,225,249 B1
(45) Date of Patent: Jul. 17, 2012

(54) STATIC FORMAL VERIFICATION OF A CIRCUIT DESIGN USING PROPERTIES DEFINED WITH LOCAL VARIABLES

(75) Inventor: Johan Martensson, Gothenburg (SE)

(73) Assignee: Jasper Design Automation, Inc., Mountain View, CA (US)

( * ) Notice: Subject to any disclaimer, the term of this patent is extended or adjusted under 35 U.S.C. 154(b) by 700 days.

(21) Appl. No.: 12/132,186

(22) Filed: Jun. 3, 2008

Related U.S. Application Data

(60) Provisional application No. 60/941,683, filed on Jun. 3, 2007.

(51) Int. Cl.
*G06F 17/50* (2006.01)

(52) U.S. Cl. .................................. 716/106; 716/107

(58) Field of Classification Search .............. 716/4–5, 716/103, 106, 107, 136; 702/117–119, 123
See application file for complete search history.

(56) References Cited

U.S. PATENT DOCUMENTS

| | | | | |
|---|---|---|---|---|
| 2003/0125920 A1* | 7/2003 | Matsuoka et al. | ............... | 703/15 |
| 2005/0081169 A1* | 4/2005 | Levitt et al. | ............... | 716/5 |
| 2006/0156145 A1* | 7/2006 | Mitra et al. | ............... | 714/742 |

OTHER PUBLICATIONS

Bustan, D. et al., "Some Complexity Results for System Verilog Assertions," 2006, Springer-Verlag, Berlin, Heidelberg, pp. 205-218.
Havlicek, J. et al., "Notes on the Semantics of Local Variables in Accellera System Verilog 3.1 Concurrent Assertions," Accellera Technical Report 2004.01, May 2004, 72 pages.
"IEEE Standards for SystemVerilog—Unified Hardware Design, Specification, and Verification Language," IEEE Std 1800™—2005, Nov. 22, 2005, 10 pages.
Vardi, M.Y., "An Automata-Theoretic Approach to Linear Temporal Logic," Lecture Notes in Computer Science, 1996.

\* cited by examiner

*Primary Examiner* — Vuthe Siek
(74) *Attorney, Agent, or Firm* — Fenwick & West LLP

(57) ABSTRACT

A static formal verification tool is used to test properties for a circuit design, where the properties are written in a verification language, such as SystemVerilog, that allows local variables. The use of local variables presents implementation challenges for static formal verification tools because it requires multiple instances of the local variables to be tracked during the verification process. To deal with local variables, the static formal verification tool translates a property containing local variables into an optimized, statically allocated data structure that does not need multiple representation of different instances of the local variables. The formal verification is then performed using the data structure. This reduces the verification complexity and makes the size of the problem representation predictable.

28 Claims, 2 Drawing Sheets

STATIC FORMAL VERIFICATION OF A CIRCUIT DESIGN USING PROPERTIES DEFINED WITH LOCAL VARIABLES

CROSS REFERENCE TO RELATED APPLICATIONS

This application claims the benefit of U.S. Provisional Application No. 60/941,683, filed Jun. 3, 2007, which is incorporated by reference in its entirety.

BACKGROUND

This invention relates generally to formal verification of circuit designs, and more particularly to static formal verification of circuit designs having properties defined using local variables.

Circuit designs for digital logic are often coded in a Hardware Description Language (HDL), such as SystemVerilog. This code is then verified, or checked for functional correctness. Assertion-based verification (ABV) is a functional verification technique that uses properties, or statements about the behavior of the design, to verify different aspects of the design. Different functional verification tools either monitor or prove the validity of the property, or assertion.

The SystemVerilog language contains a powerful assertion language, called SystemVerilog Assertions (SVA), which is used to write properties. One of the distinguishing features of SVA is the local variable. A local variable is a construct that is used in a sequence or property to store a data value within the property itself. This allows the data value to be compared at a future cycle of the property.

The following simple example illustrates a local variable used in a property that verifies the expected output for a in-order pipeline design with a fixed delay. The local variable is x. When the signal valid_in is asserted, x is assigned and stores the value of the signal pipe_in. Five cycles later, the property is evaluated true if the value of pipe_out1 is x+1; otherwise it is false.

```
property e;
    int x;
    (valid_in, x = pipe_in) | → ##5 (pipe_out1 == (x + 1));
endproperty
```

This simple example contains a local variable that is accessed in order and with a small fixed delay. In dynamic ABV, a new copy of the local variable x is created and initialized for each cycle of simulation whenever valid_in is true. This phenomenon is known as sequence overlap. The value of the local variable is checked five cycles later against pipe_out1, thus giving a maximum limit to the number of outstanding copies of local variable x.

There are different implementation techniques as a result of varying requirements of different verification technologies. Both simulation and dynamic formal verification tools dynamically allocate memory as needed for local variables during verification runtime. In the example above, simulation and dynamic formal verification tools might dynamically allocate memory for at least five copies of the local variable.

Static formal verification tools, in contrast, cannot rely on dynamically allocating memory for SVA variables during run-time. Instead the whole model (circuit design and formal verification specification) is compiled into a statically allocated structure. This means that existing static formal verification tools must be able to determine, during compile time, the number of copies of the local variable needed during verification. For the example above, static formal verification tools can implement a shift register to store the copies of the local variable using the fixed delay.

But it is not always possible for a static verification tool to determine the number of local variables that will be needed. The following complex example illustrates such a situation. This property contains a variable latency with a local variable that is accessed out of order:

```
property stack_req;
    logic [stack_width:1] data;
    logic [counter_width-1:0] mylevel;
    @ (posedge clk)
    (push && (pop || !stack_full), data = data_in, mylevel = 0)
    ##1 (mylevel > 0, mylevel=mylevel+(!stack_full*push-pop)) [*0:$]
    ##1 (pop && mylevel==0)
    | = > (data==data_out);
endproperty
```

This property may be used, for example, to check the correct behavior of a stack. In the property, there are two local variables, data and mylevel. The variable data is used to record some value that is stored on the stack, while the variable mylevel is used to keep track of the relative position of the stack at which the value in question is stored. When there is a push and the stack is not full or there is a simultaneous pull, the value on signal data_in is stored in the local variable data, and the value 0 is stored in the variable mydata. Then, successive pushes and pulls will increment or decrement the variable mylevel, respectively, as long as mylevel is positive. This occurs until mylevel is 0, at which point the signal data_out is compared to the value stored in the variable data.

This complex example illustrates some of the challenges for the implementation of local variables. First, new copies of data and mylevel are needed for every cycle where there is a push to store their correct values at the cycle in question. However, there is variable delay from when data is assigned to when data is compared, and there can be any number of assignments to the variable mylevel in between. In the case of dynamic verification, there seems to be no way to determine in advance how many copies of the variables in question will be needed for an arbitrary trace. It doesn't seem feasible to compute a maximum number of copies sufficient to represent all the instances of possible overlap.

What is needed, therefore, is a static verification tool that can represent overlapping instances of a local variable without copying of variables during a static formal verification process.

SUMMARY

One approach to the problem of implementing local variables in static formal verification tools is to avoid creating multiple copies of the same local variable. To accomplish this, the property containing the local variable may be translated into a data structure that removes the overlap and thus does not contain additional copies of the local variable.

In one embodiment of the invention, a formal verification tool receives a design with one or more properties that use a local variable. The static formal verification tool translates one or more of these properties having local variables into a optimized data structure suitable for functional formal verification. The data structure may comprise a portion of a circuit that is equivalent to the property or otherwise tests the property. Accordingly, the formal verification tool then verifies the circuit design using this equivalent translation of the property, rather than the original property that included the local variable. In accordance with embodiments of the invention, this translation can be done in such a way that the need for multiple copies of the local variables can be eliminated.

One benefit of the translation process, in accordance with embodiments of the invention, may be that, by removing the need to have duplicate copies of the same local variable, the complexity of the data structure representing the property is known at compile time. For certain circuit designs, knowing the complexity of the data structure may be necessary for compilation. Moreover, embodiments of the invention may reduce the complexity of the data structure, which translates into a reduced memory requirement and a faster completion time of the verification process.

With previous static formal verification tools, a user would have to write properties with local variables carefully so as to make the number of overlapping instances of the variable computable; otherwise, verification tools may not be able to process them. This limitation would restrict the user from fully benefiting from the rich expressiveness of local variables. But with embodiments of the invention, the user can write more complex properties with local variables. In one embodiment, for example, the user then inputs the HDL model of the circuit design along with the formal verification specification into the static formal verification tool. The tool compiles the circuit design and the formal verification specification into statically allocated structures. For a property that uses one or more local variables, the tool compiles the property into an optimized data structure with no duplicate copies of the local variables. The static formal verification tool then formally verifies the property using the optimized data structure. This compilation of the property is faster and more efficient, compared to previous static formal verification techniques.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Tool Flow and Methodology for Formal Verification

Figure 1:
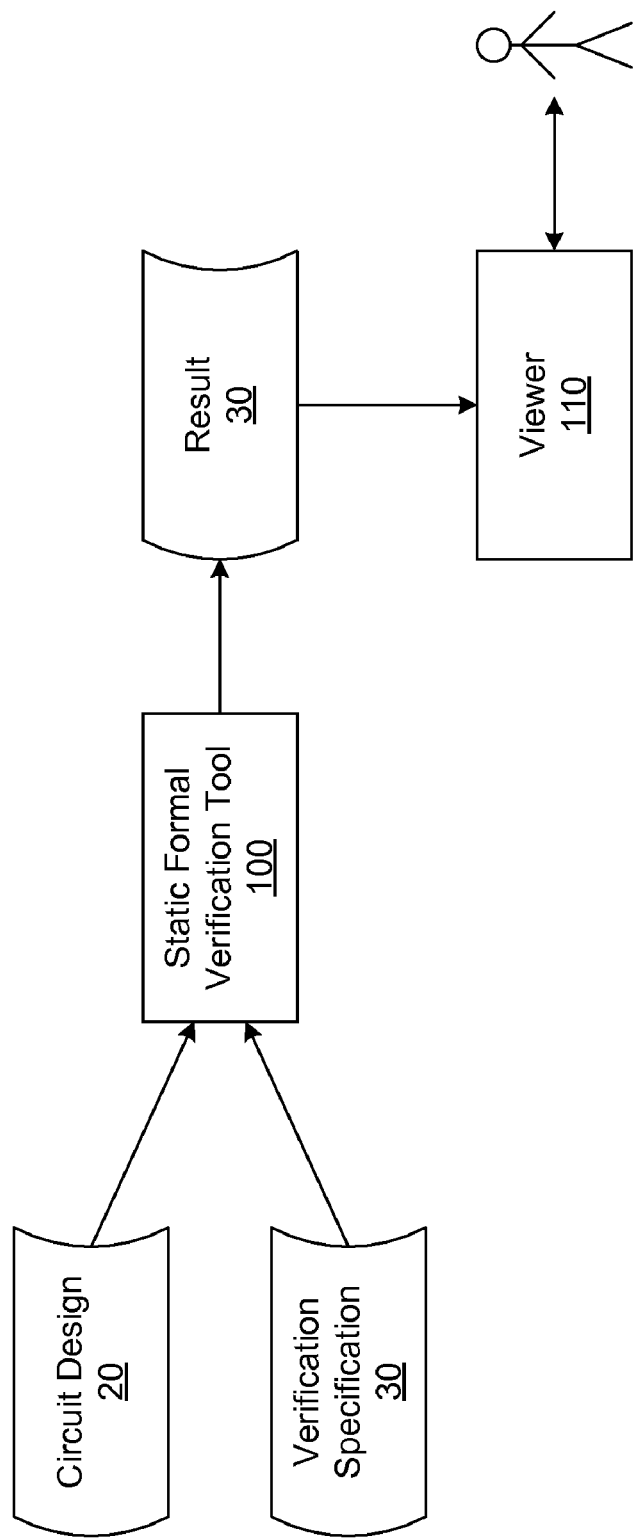
FIG. 1 is a diagram of a verification methodology in accordance with an embodiment of the invention.

FIG. 1 illustrates an embodiment of a methodology for formal verification of a circuit design 20. The circuit design 20 may be embodied in a data file encoded using a hardware description language (HDL), which may describe the structural design and operation of a circuit. A set of requirements is derived from a design specification for the circuit and then used to test whether the circuit design is compliant with the design specification. A user, such as a circuit designer or a verification engineer, may supply the requirements for the circuit design. The requirements may be encoded in a verification specification 30 using a hardware verification language, such as SystemVerilog (which is a combined hardware description language and hardware verification language).

The verification specification 30 may be directly coded by a user or captured in an automated process.

The verification specification 30 includes one or more properties for the circuit design 20. Each property may be represented in the verification specification 30 as an assertion, where the property is satisfied if the assertion is true for all operating conditions of the circuit design 20. If the property is encoded using SystemVerilog, the property may be a SystemVerilog Assertion (SVA), which allows a property or assertion to be defined using local variables. The following description considers one property in the requirements model; however, in practice a verification specification 30 will often have many properties or assertion, each of which may use one or more local variables.

Figure 2:
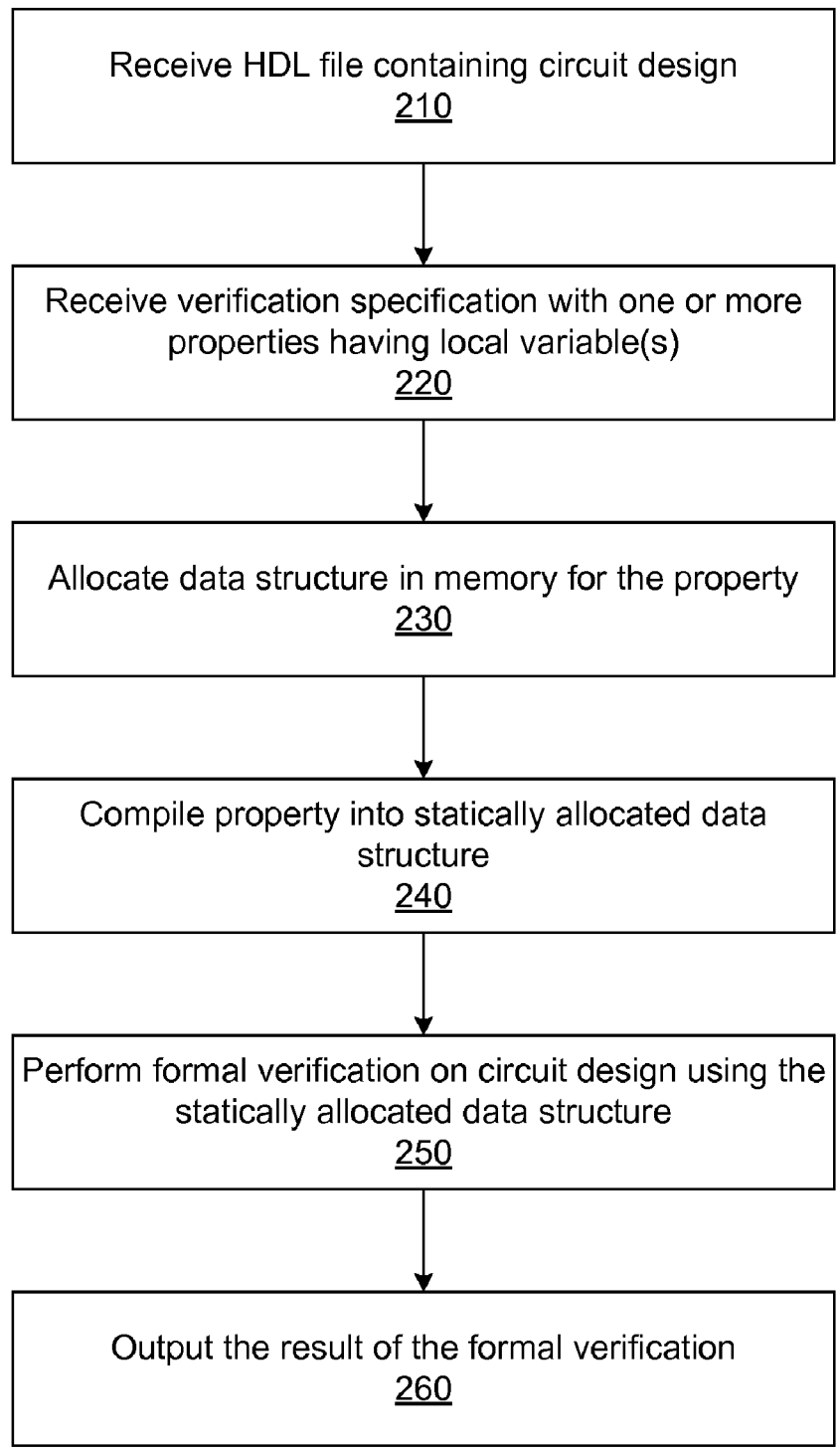
FIG. 2 is a flow chart of a static formal verification process performed by the verification tool 100 of FIG. 1, in accordance with an embodiment of the invention.

FIG. 2 illustrates a process for formal verification that is performed by the verification tool 100 of FIG. 1, in accordance with one embodiment. In this process, the verification tool 100 receives 210 a circuit design 20 and receives 220 a verification specification 30 for testing the circuit design 20 against a set of requirements. The circuit design 20 and verification specification 30 may be represented in one or more files containing HDL code (e.g., Verilog, SystemVerilog, or the like), which define a digital design and/or SVA properties (possibly containing local variables) that give a functional specification of the design.

Because the verification tool 100 performs static formal verification, it allocates 230 a static data structure. The tool 100 then compiles 240 the property into that data structure. During the compiling process, the verification tool 100 may convert the inputs (i.e., the circuit design 20 and verification specification 30) into an internal representation using one or more data structures. In one embodiment, the data structures comprises a netlist. This conversion may comprise two different conversions: (1) synthesis of the input circuit design 20, and (2) property compilation of the properties in the verification specification 30. Embodiments of the property compilation process are described in more detail below.

The results of the design synthesis and the property compilation are then combined into a common problem instance that is given as input to a model checker in the verification tool 100. The verification tool 100 then performs 250 formal verification on the circuit design 20 using the statically allocated data structure. During the formal verification process, the model checker attempts to determine whether there is a possible behavior of the circuit design 20 where one of the properties in the verification specification 30 are not true, which is called a counterexample for the property. If, after an exhaustive search, no counterexample can be found for a property, the property is said to be proven. The results 30 of the formal verification process thus comprise an indication of whether one or more of the properties are satisfied, and if not, the counterexample showing a condition under which the property fails. The tool 100 outputs 260 the result 30 of the verification process.

The result 30 of the formal verification process may be stored in memory, passed along to another software process, or displayed to the user. The result may comprise a counterexample if the circuit design 20 fails to meet the properties encoded in the verification specification or a witness if the design 20 satisfies the properties. A viewer 110 may also be included to display the counterexample or witness to a circuit designer. This can facilitate understanding of what aspect of the HDL code in the circuit design 20 is responsible for the counterexample to the property in question.

Translation of Properties Containing Local Variables

The translation of a property containing one or more local variables into an equivalent data structure (e.g., a circuit) that is usable by a static formal verification tool can be accomplished in a variety of ways. In one embodiment, this translation is accomplished using a technique described below.

Described herein is a process in which a formula can be translated into a circuit by means of intermediary representations called a non deterministic Büchi automaton (NBA) and a Büchi automaton (BA). These are representations defined in automata theory, and they can be used to identify infinite behaviors of a circuit—that is, infinite sequences of successive states of a circuit. The translation of SVA properties without local variable assignments into circuits via representations of this kind is well known; however, a challenge addressed by embodiments of the invention is to extend this translation to the case where the properties to be translated contain local variable assignments in such a way that the representation of the local variables need not be duplicated.

Words and Letters

To model runs of a hardware system, the concept of a word is used. A word w can be thought of as a possibly infinite sequence of states of the system (the letters), where each of the states (each letter) defines a value for all signals of the system. A set of letters is called an alphabet. If $\Sigma$ is an alphabet, then $\Sigma^\omega$ is the set of infinite sequences of letters in $\Sigma$. For an alphabet $\Sigma$ if $w \in \Sigma^\omega$, let $w^n$ be the $n+1^{th}$ letter of w, i.e. $w = w^0 w_1 w^2 \ldots$. In examples below, the notation (abc) is used to denote a letter at which signals a, b, and c are true and all other signals are false. This notation can also be used to denote words by concatenating letters of this kind For example, (ab)(abc)(abc)(bc) . . . is an infinite word where a is true at the first three letters and b and c are true from the second letter and onwards.

Branching Semantics of SVA Formulas

The semantics of SVA temporal formulas is given as a relation of satisfaction between an infinite word and a formula, and the semantics of a sequence is given as a relation of matching between a finite word and the sequence. The semantics of some SVA sequence and formula operators are such that depending on the nature of a word (with respect to which the formula or sequence is evaluated), the evaluation of the formula can be said to branch off into different alternative evaluations of the sub formulas and sub sequences of the formula. For example, the evaluation of sequence a[*0:$]##1b[*0:$] branches off into five alternative evaluations on the finite word (ab)(ab)(ab)(ab). When explaining why the sequence in question matches on the word there are five alternative accounts:

1. b is true at all four letters.
2. a is true at the first letter and b is true at the rest.
3. a is true at the first two letters and b is true at the rest.
4. a is true at the first three letters and b is true at the last.
5. a is true at all four letters.

This kind of branching is called disjunctive branching because each of the different branches is sufficient for satisfaction. The branching in this case is also overlapping, meaning that the different evaluations concern the same segment of the word.

There is also conjunctive branching. For example, the SVA property r↦s is true for an infinite word w if and only if for each finite segment of w at which r matches s must also match. This means that for the formula to be satisfied on a word it may be required that more than one branch of the sequence s matches.

Different sequence and formula operators give rise to different forms of branching. For example, the sequence operators ##1, ##0, [*0:$] and or may cause disjunctive branching and the formula operator ↦ and the sequence operator intersect may cause conjunctive branching. If a sub formula is in a negative context, then this description is reversed. For example in the (top level) formula not(a[*0:$]##1b), for both [ *0:$] and ##1 the branching is conjunctive.

Branching and Local Variables

SVA local variables can be used to collect values in one part of a SVA formula for use in another part of the same formula. The local variables are not visible outside of the formula for which they are declared and in this sense they are local to the formula. However, they are not only local to the formula, but in many cases they are local to each evaluation branch of the formula. For example in the formula:

$$(a, v=e_1)\#\#1(b, v++)[*0:\$]\#\#1c \mapsto v==e_2,$$

for each match of the left hand side sequence of the operator ↦, the value of the local variable v is collected from the value of $e_1$ at a cycle where a is true. It is incremented for a number of cycles where b is true and in continuity with a cycle where c is true at which the value of v is compared to that of the expression $e_2$.

Even if different evaluation branches of the left hand side sequence overlap, the assignments and the resulting value of the local variable are local to each (possibly overlapping) evaluation instance. This means that an assignment that occurs in one evaluation branch will not influence the simultaneous value of the same variable in one other evaluation branch. The number of possible overlapping evaluation branches in a situation like this is unbounded. In a simulation run, only a finite number of overlapping evaluation branches will be active at the same time because every simulation run is finite, and the actual number of instances of the variable that need to be allocated is determined by the nature of the particular simulation run.

Overlapping Branches in Formal Verification

In simulation, the fact of unbounded overlap between evaluation branches may present a practical problem but for formal verification it may present a problem in principle. In formal verification, in contrast to simulation, the property is not evaluated along a concrete run of the system under verification. Instead, the property is represented in such a way that it can be computed whether there exists any run of the system that contradicts the property. In this situation, there may be no way to compute the maximal number of overlapping instances that can occur in some run that is considered during verification. Accordingly, embodiments of the invention address these methods of formal verification where the representation of the property is compiled in advance of the actual verification. Since there may be no way to predict the maximal number of overlapping evaluation branches the method, used in simulation, of allocating different instances of the variable cannot be used.

Overview of Translation

Embodiments of the invention solve this problem for a large and useful class of SVA formulas with local variables by applying the observation that a counterexample run of a system contradicts a formula if and only if it contradicts exactly one of the conjunctive branches of the formula. This observation is a generalization of the fact that a Boolean conjunction A∧B∧C is false if and only if one of the conjuncts A, B or C is false. For example, in the example formula above, the left hand side sequence $(a, v=e_1)\#\#1(b, v++)[*0:\$]\#\#1c$ can match in any number of overlapping ways, but analysis shows that all these overlapping branching matches are example of conjunctive branching. This means that for a particular counterexample trace only one of the possibly many overlapping matches of the sequence will be necessary for it to be a counterexample, so for each counterexample the variable v need only be represented once. This observation is used in compiling the formula in such a way that only one of the conjunctive branches of the formula can be active at the same time during verification.

The description herein contains a definition of the subset of the SVA temporal language that can be translated according to embodiments of the invention. It is also shown that all formulas in this subset can be translated in such a way that assignments to the same variable do not occur in different overlapping disjunctive branches, and that those formulas can thus be translated without allocating more than one instance of each variable. The following is a description of how an SVA formula containing local variables can be compiled into a circuit representation so that there is no requirement of multiple copies of the representation of any variable, in accordance with embodiments of the invention.

Valuations and Assignments

Let V be a finite set of variables. A variable valuation L is a function from V to K (L:V→K) where K is a set of values. A variable valuation thus associates a value from K to each variable in V.

The following definition of ⊕ is presented. Let Dom(L) be the set of variables for which L is defined, and for variable valuations L and L' where L|(Dom(L)∩Dom(L'))=L'|(Dom(L)∩Dom(L')). (This says that L and L' do not conflict, with respect to the variables for which both are defined.) Let L⊕L' be the variable valuation L" defined thus:

$$L''(v) = \begin{cases} L(v) & \text{if } v \in Dom(L) \\ L'(v) & \text{if } v \in Dom(L') \setminus Dom(L) \\ \text{undefined} & \text{otherwise} \end{cases}$$

Let Val={L|L:V→K}. Val is thus the set of all valuations for V. An assignment is an action on some variables in V possibly resulting in a value update of some of those variables. An assignment is thus a function from Val to Val. We define Ass={ass|ass:Val→Val}. In this way, Ass is the set of all assignments.

The translation of formulas into circuits is a three step process. First, the formula will be translated into a non deterministic Büchi automaton (an NBA). This automaton will then be converted into an equivalent deterministic Büchi automaton (a BA), which will then be converted into a circuit.

NBA

An NBA is a tuple ⟨Σ,S,I,F,v⟩, where Σ is a finite alphabet, S a finite set of states, I ⊂ S a set of initial states, F ⊂ S a set of accepting states and v:S×Σ→$2^S$ a total transition function. A run R on NBA A for a word w∈$Σ^ω$ and an initial valuation $L_0$ is a function from N to S such that R(0)∈I, and, for all n, R(n+1)∈v(⟨R(n),w"⟩). A accepts a word w if w has a run R on A that passes through some state in F infinitely many times.

Languages

The following definition of an SVA Sequence is presented. If b is a Boolean expression and ass∈Ass, the language of SVA Sequences (SEQ) r has the following grammar:

r::=[*0]|b|(1,ass)|$r_1$##$1r_2$|$r_1$##$0r$ or r|r intersect r|r[*0:$].

Let 1 and 0 stand for any Boolean tautology and contradiction, respectively.

The following definition of an SVA Formula is presented. If r is a SEQ, the language of SVA formulas (SVA) φ has the following grammar:

φ::=True|r|not φ|φ and φ|φ|φ or φ|r↦φ

In the following, for simplicity, we will use the following negation free language instead.

The following definition of a Negation free SVA Formula is presented. If r is a SEQ, the language of negation free SVA formulas (NFSVA) φ has the following grammar:

φ::=True|False|φ and φ|φ or φ|r↦φ|r◇→φ

The semantics of r◇→φ is that of not(r↦ not φ).

For simplicity of exposition we add the following construct on the NFSVA level: r is an abbreviation of r◇→True.

Negate the Formula

We then define, inductively, Neg:SVA→NFSVA:

Neg(r)=r↦False

Neg(True)=False

Neg(not φ)=Neg(Neg(φ))

Neg(φ and ψ)=Neg(φ) or Neg(ψ)

Neg(φ or ψ)=Neg(φ) and Neg(ψ)

Neg(r↦ψ)=r◇→Neg(ψ)

Neg(r◇→ψ)=r↦Neg(ψ)

Helper Functions

Let η be a normalizing function η:NFSVA→NFSVA, η:SEQ→SEQ. We define ⊗:(SEQ×Val)×(SEQ×Val)→SEQ×Val thus:

⟨r,L⟩⊗⟨r',L'⟩=⟨η(r intersect r'), L⊕L'⟩ and ⊗:(NFSVA×Val)×(NFSVA×Val)→NFSVA×Val thus:

⟨φ,L⟩⊗⟨φ',L'⟩=⟨η(φ and φ'), L⊕L'⟩.

Then, ⊗ is only defined when the valuations in the operands are non conflicting. ⊗ is associative and commutative with identity elements ⟨1,∅⟩ and ⟨True,∅⟩, respectively.

We then define ⊗$2^{(SEQ×Val)}$×$2^{(SEQ×Val)}$→$2^{(SEQ×Val)}$ (⊗:$2^{(NFSVA×Val)}$×$2^{(NFSVA×Val)}$→$2^{(NFSVA×Val)}$. For γ, γ' ⊆ SEQ×Val, (⊆ NFSVA×Val) thus: Let γ⊗γ'={v⊗v' v∈γ and v'∈γ'}

We presuppose a relation of Boolean satisfaction l, L⊫b relating a letter l, a variable evaluation L and a Boolean expression b.

Transition Function for SVA Sequences

We give an inductive definition of a function θ:(NFSVA×Val)×Σ→$2^{NFSVA×Val}$. To this end we start by defining similarly for the set of sequences SEQ:ρ:(SEQ×Val)×Σ→$2^{SEQ×Val}$. We start by providing cases for the basic SEQs.

(BOOL) ρ(⟨⟨b, L⟩, l⟩) = $\begin{cases} \{⟨[*0], L⟩\} & \text{if } l, L ⊫ b \\ \emptyset & \text{otherwise} \end{cases}$ (ASS) ρ(⟨⟨(1, ass), L⟩, l⟩) = {⟨[*0], ass(L)⟩}

(EMPTY) ρ(⟨⟨[*0], L⟩, l⟩) = ∅

To define ρ for $r_1$##$1r_2$ (and for $r_1$##$0r_2$), we need a function em that calculates if a given SEQ can accept the empty word or not.

We define, inductively, for SEQs:

em([*0])=true em(b)=false em($r_1$##$1r_2$)=em($r_1$) and em($r_2$)

em($r_1$ intersect $r_2$)=em($r_1$) and em($r_2$)

em(r[*0:$])=true

We will also use a normalizing function $\eta: SEQ \rightarrow SEQ$. This function may be non trivial, but it is not necessary to describe it in this context. Now, the case for sequential composition is as follows:

$$\rho(\langle r_1\#\#1r_2,L\rangle,l\rangle) = \{\langle\eta(r'_1\#\#1r_2),L'\rangle|\langle r'_1,L'\rangle \in$$
$$\rho(\langle r_1,L\rangle,l\rangle)\} \cup \{\langle r'_2,L'\rangle|em(r_1) \wedge \langle r'_2,L'\rangle \in$$
$$\rho(\langle r_2,L\rangle,l\rangle)\}$$

And the case for overlapping sequential composition:

$$\rho(\langle r_1\#\#0r_2,L\rangle,l\rangle) = \{\langle\eta(r'_1\#\#0r_2),L'\rangle|\langle r'_1,L'\rangle \in$$
$$\rho(\langle r_1,L\rangle,l\rangle)\} \cup \{\langle r'_2,L''\rangle|\exists r'_1,L's.t\langle r'_1,L'\rangle \in$$
$$\rho(\langle r_1,L\rangle,l\rangle) \wedge em(r'_1) \wedge \langle r'_2,L''\rangle \in \rho(\langle r_2,L'\rangle,l\rangle)\}$$

The cases for 'or' and 'intersect' are as follows:

$$\rho(\langle r_1 \text{ or } r_2,L\rangle,l\rangle) = \rho(\langle r_1,L\rangle,l\rangle) \cup \rho(\langle r_2,L\rangle,l\rangle)$$

$$\rho(\langle r_1 \text{ intersect } r_2,L\rangle,l\rangle) = \rho(\langle r_1,L\rangle,l\rangle) \otimes \rho(\langle r_2,L\rangle,l\rangle)$$

The case for 'intersect' is only defined when the variable assignments in $r_1$ and the variable assignments in $r_2$ do not conflict. This can be achieved by static copying of variables due to the variable flow blocking rules of the SVA semantics.

And finally, the case for $r[*0:\$]$ is:

$$\rho(\langle r[*0:\$],L\rangle,l\rangle) = \{\langle\eta(r'\#\#1r[*0:\$]),L'\rangle|\langle r',L'\rangle \in$$
$$\rho(\langle r,L\rangle,l\rangle)\}$$

By composition we define $\rho(\langle r,L\rangle,w\rangle)$ for finite w. If $w=w^0w^1 \ldots w^n$ (where n is larger than 0), then $\rho(\langle r,L\rangle,w\rangle) = \{\langle r'',L''\rangle \in \rho(\langle r',L'\rangle,w^1 \ldots w^n)|\langle r',L'\rangle \in \rho(\langle r,L\rangle,w^0\rangle)\}$.

Transition Function for SVA Formulas

Similar to the case for SEQ, $\eta: NFSVA \rightarrow NFSVA$ is a normalization function.

$$\theta(\langle True,L\rangle,l\rangle) = \{\langle True,L\rangle\}$$

$$\theta(\langle False,L\rangle,l\rangle) = \emptyset$$

The cases for 'or' and 'and' are as follows:

$$\theta(\langle \phi \text{ or } \psi,L\rangle,l\rangle) = \theta(\langle \phi,L\rangle,l\rangle) \cup \theta(\langle \psi,L\rangle,l\rangle)$$

$$\theta(\langle \phi \text{ and } \psi,L\rangle,l\rangle) = \theta(\langle \phi,L\rangle,l\rangle) \otimes \theta(\langle \psi,L\rangle,l\rangle)$$

The case for 'and' is only defined when the variable assignments in $\phi$ and the variable assignments in $\psi$ don't conflict. This can be achieved by static copying of variables.

The cases for $\diamond\mapsto$ and $\mapsto$ are as follows:
Let $\triangleright$ stand for either $\diamond\mapsto$ or $\mapsto$.
Let $$\pi(\triangleright,r,\phi,L,l) = \{\langle\eta(r'\triangleright\phi),L'\rangle|\langle r',L'\rangle \in \rho(\langle r,L\rangle,l\rangle)\}$$

$$\overline{\omega}(r,\phi,L,l) = \{\langle\phi',L''\rangle|\exists r',L's.t.\langle r',L'\rangle \in \rho(\langle r,L\rangle,l\rangle) \wedge em(r') \wedge \langle\phi',L''\rangle \in \theta(\langle\phi,L'\rangle,l\rangle)\}_{ps}$$

Let:

$$\theta(\langle r\diamond\mapsto\phi,L\rangle,l\rangle) = \pi(\diamond\mapsto,r,\phi,L,l) \cup \overline{\omega}(r,\phi,L,l), \text{ and}$$

$$\theta(\langle r\mapsto\phi,L\rangle,l\rangle) = \pi(\mapsto,r,\phi,L,l) \otimes \overline{\omega}(r,\phi,L,l)$$

The case for $r\mapsto\phi$ is defined when $\langle\phi_1,L_1\rangle \in \pi(\mapsto,r,\phi,L)$ and $\langle\phi_2,L_2\rangle \in \overline{\omega}(r,\phi,L)$ implies $L_1=L_2$. This is the case when computing $\Theta\langle_{\phi,\emptyset}\rangle$ for $\phi \in DF$ (See sections "Disjunctive Fragment" and "Transition function defined for disjunctive fragment" below).

NBA Construction

We have defined the following function: $\theta: (NFSVA \times Val) \times \Sigma \rightarrow 2^{NFSVA \times Val}$. Let $\theta'(\langle\phi,L\rangle) = \{\langle\phi',L'\rangle|\langle\phi',L'\rangle \in \theta(\langle\phi,L\rangle,l\rangle)\}$ for some l}, and if $\gamma \subset NFSVA \times Val$ let $\Theta(\gamma) = \cup\{\theta'(v)|v \in \gamma\}$.

For each $v \in NFSVA \times Val$, $\Theta$ has a fix point for $\{v\}$, $\Theta_v$. (The proof of this relies on the properties of the normalization function $\eta$.) We define an NBA for a SVA formula $\phi$. Let $S = \Theta\langle_{Neg(\phi),\emptyset}\rangle$. Let $I = \{\langle Neg(\phi),\emptyset\rangle\}$ and let F be defined in a some standard way. Let $v = \theta|S$ and let $A = \langle\Sigma,S \times Val,I,F,v\rangle$.

Disjunctive Fragment

Definition of DSEQ. Let $DSEQ \subset SEQ$ be the set of sequences r such that for each finite word w and w and each Boolean b, $\rho(\langle r\#\#1b,L\rangle,w\rangle)$ has at most one element. Let d be any DSEQ, r be any SEQ and s be any SEQ not containing variable assignments, and let the class RHSSEQ be defined by the following grammar:

rhss::=d|s|rhss##1s|rhss##0s|rhss intersect rhss.

The following grammar defines the disjunctive fragment $(DF \subset NFSVA)$:

df::=True|False|df and df|df or df|rhss $\mapsto$ False|r $\diamond\mapsto df$

A formula $\phi \in SVA$ will be supported if and only if $Neg(\phi) \subset DF$. For example, the SVA formula $r\mapsto s$ where $r \in SEQ$ is any sequence and $s \in RHSSEQ$ is supported because $Neg(r\mapsto s) = r\diamond\mapsto(s\mapsto False)$, which is in DF.

Transition Function Defined for Disjunctive Fragment

The following fact shows that when computing an NBA for a formula in the disjunctive fragment, if there is conjunctive branching then local variable assignments that will be combined by $\oplus$ are guaranteed not to conflict. See the case for $\mapsto$ in the definition of $\theta$ above. This makes possible the translation in accordance with embodiments of the invention.

If $\phi \in DF$ and for some L, l, r and $\psi$, $\theta(\langle r\mapsto\psi,L\rangle,l\rangle)$ is computed in the course of computing $\Theta\langle_{\phi,\emptyset}\rangle$ and if $\langle\psi_1,L_1\rangle \in \pi(\mapsto,r,\psi,L)$ and $\langle\psi_2,L_2\rangle \in \overline{\omega}(r,\psi,L)$ then $L_1=L_2$.

BA

A BA is a tuple $\langle\Sigma,S,I,F,\delta\rangle$, where $\Sigma$ is a finite alphabet, S a finite set of states, $I \subset S$ a set of initial states, $F \subset S$ a set of accepting states and $\overline{\delta: S \times \Sigma \rightarrow S}$ a transition function. A run R on BA A for a word $w \in \Sigma^\omega$ and an initial valuation $L_0$ is a function from N to S such that $R(0) \in I$, and for all n $\delta(R(n), w^n) = R(n+1)$. A accepts a word w if w has a run R on A that passes through some state in F infinitely many times.

It can be appreciated that each run for a word on an BA with states in NFSVA×Val determines a unique sequence of variable valuations $L_0, L_1, L_2 \ldots$. This means that to code the state of the automaton. only one representation for each variable is needed.

Determinization with Free Variables

If w is a word then w' is a free variable extension of w if $w' = \langle w^0,n_0\rangle, \langle w^1,n_1\rangle, \langle w^2,n_2\rangle, \ldots$ where $n_0,n_1,n_2, \ldots$ are natural numbers. For each NBA A there is a BA A' such that for each word w, w has an accepting run on A if and only if there is free variable extension w' of w such that w' has an accepting run on A'.

Let $A = \langle\Sigma_A,S_A,I_A,F_A,v_A\rangle$ be an NBA and w a word that has an accepting run R on A. Since for each $\langle s,l\rangle \in S_A \times \Sigma_A$, $v_A(\langle s,l\rangle)$ is finite, assume a (total) enumeration on $v_A(\langle s,l\rangle)$, and let $v_A(\langle s,l\rangle)^n$ be the nth element of that set. For $\langle s,l\rangle \in S_A \times \Sigma_A$ and $n \in N$, define:

$$\delta(\langle s, \langle l, n\rangle\rangle) \begin{cases} v_A(\langle s, l\rangle)^n & \text{if } v_A(\langle s, l\rangle) \neq \emptyset \\ \text{undefined} & \text{otherwise} \end{cases}$$

Let A' be the BA $\langle\Sigma_A,S_A,I_A,F_A,\delta\rangle$.

Let R be an accepting run of some w on A. Define det(w, R) = w' thus: For each n let $w'^n = \langle w^n,k\rangle$, where k is such that $\delta(\langle R(n),\langle w^n,k\rangle\rangle) = R(n+1)$. It can be appreciated that R is an accepting run of det(w,R) on A'. Let R be an accepting run on A' for some $w = \langle l^0,n_0\rangle,\langle l^1,n_1\rangle,\langle l^2,n_2\rangle, \ldots$ then R is an accepting run for $l^0,l^1,l^2, \ldots$ on A.

Compiling a BA into a Circuit $\delta: (NFSVA \times Val) \times (\Sigma \times N) \rightarrow NFSVA \times Val$ defines a combinatorial circuit with state, local variable, free variable and signal input and state and local variable output. The state and local variable output is connected to the input of a register array and the output of the register array with the input of the combinatorial circuit. The register array is initialized with the (code for the) initial state of the BA, whereas the local variable value part of it is kept free. Finally, the signal input is connected to the design under verification, and the free variable input is kept unconnected.

SUMMARY

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure. For example, in addition to the foregoing and the techniques presented herein, there are various ways to accomplish the property compilation, which may depend on the types of properties written and the rules or language that governs how they are written.

Some portions of this description describe the embodiments of the invention in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments of the invention may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a tangible computer readable storage medium or any type of media suitable for storing electronic instructions, and coupled to a computer system bus. Furthermore, any computing systems referred to in the specification may include a single processor or may be architectures employing multiple processor designs for increased computing capability.

Embodiments of the invention may also relate to a computer data signal embodied in a carrier wave, where the computer data signal includes any embodiment of a computer program product or other data combination described herein. The computer data signal is a product that is presented in a tangible medium or carrier wave and modulated or otherwise encoded in the carrier wave, which is tangible, and transmitted according to any suitable transmission method.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A computer implemented method for performing static formal verification of a circuit design, the method comprising:
   receiving a circuit design encoded in a hardware description language;
   receiving a verification specification for the circuit design, the verification specification including at least one property that includes one or more local variables, wherein each local variable is a construct that stores a data value within the property;
   statically allocating at least one data structure;
   compiling, by a computer, the circuit design and the verification specification into the statically allocated data structure, wherein the data structure comprises a translation of the property and represents overlapping instances of at least one of the local variables without duplicate copies of the local variable;
   formally verifying the property using the statically allocated data structure; and
   outputting a result of the formal verification of the property.

2. The method of claim 1, wherein the circuit design and the verification specification are encoded using the SystemVerilog language.

3. The method of claim 1, wherein the property is encoded as a SystemVerilog Assertion.

4. The method of claim 1, wherein formally verifying the property is performed without repetition or copying of the local variables.

5. The method of claim 1, wherein the data structure comprises a netlist.

6. The method of claim 1, wherein the outputted result comprises a counterexample if the formally verifying determines that the property fails.

7. A method for performing static formal verification of a circuit design, the method comprising:
   receiving a model for a circuit design, the model comprising a circuit design and a set of properties, wherein one or more of the properties are expressed using one or more local variables, wherein each local variable is a construct that stores a data value within the property;
   a step for translating, by a computer, the properties having local variables into a data structure suitable for functional formal verification, the data structure comprising a translation of the properties and representing overlapping instances of at least one of the local variables without duplicate copies of the local variable;
   formally verifying one or more of the properties of the circuit design using the data structure; and
   outputting a result of the formal verification.

8. The method of claim 7, wherein data structure resulting from the step for translating comprises a portion of a circuit that is equivalent to one or more of the properties.

9. The method of claim 7, wherein data structure resulting from the step for translating comprises a portion of a circuit that tests one or more of the properties.

10. The method of claim 7, wherein the circuit design and the set of properties are encoded using the SystemVerilog language.

11. The method of claim 7, wherein the set of properties is encoded as a SystemVerilog Assertion.

12. The method of claim 7, wherein formally verifying the properties is performed without repetition or copying of the local variables.

13. The method of claim 7, wherein the data structure comprises a netlist.

14. The method of claim 7, wherein the outputted result comprises a counterexample if the formally verifying determines that one or more of the set of properties fails.

15. A computer program product for performing static formal verification of a circuit design, the computer program product comprising a non-transitory computer-readable storage medium containing computer program code for:
    receiving a circuit design encoded in a hardware description language;
    receiving a verification specification for the circuit design, the verification specification including at least one property that includes one or more local variables, wherein each local variable is a construct that stores a data value within the property;
    statically allocating at least one data structure;
    compiling the circuit design and the verification specification into the statically allocated data structure, wherein the data structure comprises a translation of the property and represents overlapping instances of at least one of the local variables without duplicate copies of the local variable;
    formally verifying the property using the statically allocated data structure; and
    outputting a result of the formal verification of the property.

16. The computer program product of claim 15, wherein the circuit design and the verification specification are encoded using the SystemVerilog language.

17. The computer program product of claim 15, wherein the property is encoded as a SystemVerilog Assertion.

18. The computer program product of claim 15, wherein formally verifying the property is performed without repetition or copying of the local variables.

19. The computer program product of claim 15, wherein the data structure comprises a netlist.

20. The computer program product of claim 15, wherein the outputted result comprises a counterexample if the formally verifying determines that the property fails.

21. A computer program product for performing static formal verification of a circuit design, the computer program product comprising a non-transitory computer-readable storage medium containing computer program code for:
    receiving a model for a circuit design, the model comprising a circuit design and a set of properties, wherein one or more of the properties are expressed using one or more local variables, wherein each local variable is a construct that stores a data value within the property;
    a step for translating the properties having local variables into a data structure suitable for functional formal verification, the data structure comprising a translation of the properties and representing overlapping instances of at least one of the local variables without duplicate copies of the local variable;
    formally verifying one or more of the properties of the circuit design using the data structure; and
    outputting a result of the formal verification.

22. The computer program product of claim 21, wherein data structure resulting from the step for translating comprises a portion of a circuit that is equivalent to one or more of the properties.

23. The computer program product of claim 21, wherein data structure resulting from the step for translating comprises a portion of a circuit that tests one or more of the properties.

24. The computer program product of claim 21, wherein the circuit design and the set of properties are encoded using the SystemVerilog language.

25. The computer program product of claim 21, wherein the set of properties is encoded as a SystemVerilog Assertion.

26. The computer program product of claim 21, wherein formally verifying the properties is performed without repetition or copying of the local variables.

27. The computer program product of claim 21, wherein the data structure comprises a netlist.

28. The computer program product of claim 21, wherein the outputted result comprises a counterexample if the formally verifying determines that one or more of the set of properties fails.

* * * * *